(12) United States Patent
Liu et al.

(10) Patent No.: US 11,092,385 B2
(45) Date of Patent: Aug. 17, 2021

(54) COMPLEX VAPOR CHAMBER STRUCTURE

(71) Applicant: ASIA VITAL COMPONENTS (CHINA) CO., LTD., Shenzhen (CN)

(72) Inventors: Xue-Hui Liu, Shenzhen (CN); Jiu-Ming Chen, Shenzhen (CN); Jian-Wu Yin, Shenzhen (CN)

(73) Assignee: Asia Vital Components (China) Co., Ltd., Shenzhen (CN)

( * ) Notice: Subject to any disclaimer, the term of this patent is extended or adjusted under 35 U.S.C. 154(b) by 0 days.

(21) Appl. No.: 16/420,175

(22) Filed: May 23, 2019

(65) Prior Publication Data

US 2020/0370837 A1    Nov. 26, 2020

(51) Int. Cl.
*F28D 15/02* (2006.01)
*F28F 3/12* (2006.01)
*F28D 15/04* (2006.01)

(52) U.S. Cl.
CPC ..... *F28D 15/0275* (2013.01); *F28D 15/0266* (2013.01); *F28D 15/04* (2013.01); *F28F 3/12* (2013.01)

(58) Field of Classification Search
CPC .. F28D 15/0275; F28D 15/0266; F28D 15/04; F28D 15/0233; F28D 15/043; F28F 3/12; F28F 2245/02; H01L 23/427; H05K 7/20336
USPC .................................................. 166/104.26
See application file for complete search history.

(56) References Cited

U.S. PATENT DOCUMENTS

| | | | | |
|---|---|---|---|---|
| 5,253,702 A * | 10/1993 | Davidson | ............ | F28D 15/0233 165/80.4 |
| 5,647,430 A * | 7/1997 | Tajima | ................ | F28D 15/0266 165/104.21 |
| 6,714,413 B1 * | 3/2004 | Ghosh | ................. | F28D 15/0266 165/104.21 |
| 7,540,318 B2 * | 6/2009 | Nitta | ................... | F28D 15/0233 165/104.26 |
| 9,772,143 B2 * | 9/2017 | Yang | ......................... | F28F 1/32 |
| 10,119,766 B2 * | 11/2018 | Lin | ...................... | F28D 15/0266 |
| 2002/0029873 A1 * | 3/2002 | Sugito | ..................... | F28F 13/06 165/166 |
| 2005/0028965 A1 * | 2/2005 | Chen | ................... | F28D 15/0275 165/104.21 |

(Continued)

FOREIGN PATENT DOCUMENTS

| | | |
|---|---|---|
| CN | 201479531 U | 5/2010 |
| TW | M522322 U | 5/2016 |
| TW | M562957 U | 7/2018 |

*Primary Examiner* — Tho V Duong
(74) *Attorney, Agent, or Firm* — Thomas J. Nikolai; DeWitt LLP

(57) ABSTRACT

A complex vapor chamber structure includes a main body and at least one tubular body. The main body has a first chamber, a first opening and a second opening. A first capillary structure is disposed in the first chamber. A working fluid is filled in the first chamber. The first and second openings pass through one face of the main body to communicate with the first chamber. The tubular body has a first end, a second end and a passage. The first and second ends are respectively correspondingly inserted in the first and second openings, whereby the passage of the tubular body communicates with the first chamber via the first and second ends to form a loop for vapor-liquid circulation.

12 Claims, 6 Drawing Sheets

(56) References Cited

U.S. PATENT DOCUMENTS

2005/0178532 A1\* 8/2005 Meng-Cheng ...... F28D 15/0233
              165/104.33
2009/0145588 A1\* 6/2009 Liu ..................... F28D 15/0266
              165/151

\* cited by examiner

COMPLEX VAPOR CHAMBER STRUCTURE

BACKGROUND OF THE INVENTION

1. Field of the Invention

The present invention relates generally to a vapor chamber structure, and more particularly to a complex vapor chamber structure with greatly enhanced heat dissipation efficiency.

2. Description of the Related Art

Currently, there is a trend to produce miniaturized electronic apparatuses with thin thickness and light weight. Therefore, various components of the electronic apparatuses must be miniaturized along with the electronic apparatuses. With the miniaturization of the electronic apparatuses, the heat dissipation problem has become a major obstacle to the improvement of the performance of the electronic apparatuses and systems. In order to effectively solve the heat dissipation problem of the components in the electronic apparatuses, many manufacturers have developed various vapor chambers and heat pipes with better heat conduction performance.

A vapor chamber includes a rectangular case and capillary structure disposed on the wall face of the internal chamber of the case. In addition, a working fluid is filled in the case. One face, (that is, the evaporation section) of the case is attached to a heat generation component (such as a central processing unit, a Northbridge/Southbridge chipset, a transistor, etc.) to absorb the heat generated by the heat generation component. Accordingly, the liquid working fluid at the evaporation section of the case will evaporate into vapor working fluid to conduct the heat to the condensation section of the case. The vapor working fluid at the condensation section of the case is then cooled into liquid working fluid. The liquid working fluid then flows back to the evaporation section due to gravity or capillary attraction of the capillary structure to continue the vapor-liquid circulation so as to spread and dissipate the heat.

The working principle and theory of the heat pipe are both identical to those of the vapor chamber. A capillary structure is disposed on the inner wall face of the heat pipe. Then the heat pipe is vacuumed and filled with a working fluid. Finally, the heat pipe is sealed to form a heat pipe structure. The liquid working fluid at the evaporation section is heated and evaporated to spread to the condensation end. After leaving the evaporation section, the vapor working fluid spreads to the condensation end and is gradually cooled into liquid working fluid. The liquid working fluid then flows back to the evaporation section due to capillary attraction of the capillary structure.

In comparison with the vapor chamber, the heat pipe is only different from the vapor chamber in heat conduction manner. The vapor chamber conducts heat in a two-dimensional manner, that is, conducts heat in a face-to-face manner, while the heat pipe conducts heat in a one-dimensional manner, (that is, remote end heat dissipation). It is insufficient for the current electronic component to simply use the heat pipe or the vapor chamber to dissipate the heat. Therefore, some manufacturers have combined the vapor chamber and the heat pipe to dissipate the heat together. When the liquid working fluid in the vapor chamber is heated and evaporated into vapor working fluid, part of the vapor working fluid will flow to the top side of the vapor chamber, while the other part of the vapor working fluid will flow to the condensation end of the heat pipe and turn liquid working fluid. Thereafter, under the capillary attraction of the capillary structure of the heat pipe, the liquid working fluid will flow back to the vapor chamber to continue the vapor-liquid circulation. The conventional combination of the vapor chamber and heat pipe can achieve both the heat spreading effect and the remote end heat dissipation effect. However, the flowing path of the liquid working fluid flowing back from the condensation end of the heat pipe to the vapor chamber is relatively elongated. As a result, the heat dissipation time is increased. This leads to poor heat dissipation efficiency.

SUMMARY OF THE INVENTION

It is therefore a primary object of the present invention to provide a complex vapor chamber structure, which can greatly enhance the heat dissipation efficiency.

To achieve the above and other objects, the complex vapor chamber structure of the present invention includes a main body and at least one tubular body. The main body has a first chamber, a first opening and a second opening. A first capillary structure is disposed in the first chamber. A working fluid is filled in the first chamber. The first and second openings pass through one face of the main body to communicate with the first chamber. The tubular body has a first end, a second end and a passage. The first and second ends are respectively correspondingly inserted in the first and second openings, whereby the passage of the tubular body communicates with the first chamber via the first and second ends.

According to the structural design of the present invention, the main body is attached to at least one heat source. At this time, the first plate body (the evaporation section) of the main body will first absorb the heat generated by the heat source, whereby the liquid working fluid in the first chamber will evaporate into vapor working fluid. Part of the vapor working fluid will spread to conduct the heat to the second plate body 20b (the condensation section) of the main body. At the condensation section, the vapor working fluid is cooled and condensed into the liquid working fluid. The liquid working fluid drops onto the first capillary structure and flows back to the first plate body to continue the vapor-liquid circulation and achieve the heat spreading and dissipation effect. In addition, as aforesaid, the passage of the tubular body communicates with the first chamber of the main body. Therefore, the other part of the vapor working fluid will spread to the passage of the tubular body and condense into the liquid working fluid. Therefore, the complex vapor chamber structure of the present invention has both two-dimensional and three-dimensional heat conduction manners, whereby the first chamber of the main body and the passage of the tubular body form a loop for the vapor-liquid circulation. This can greatly enhance the heat dissipation efficiency as a whole.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
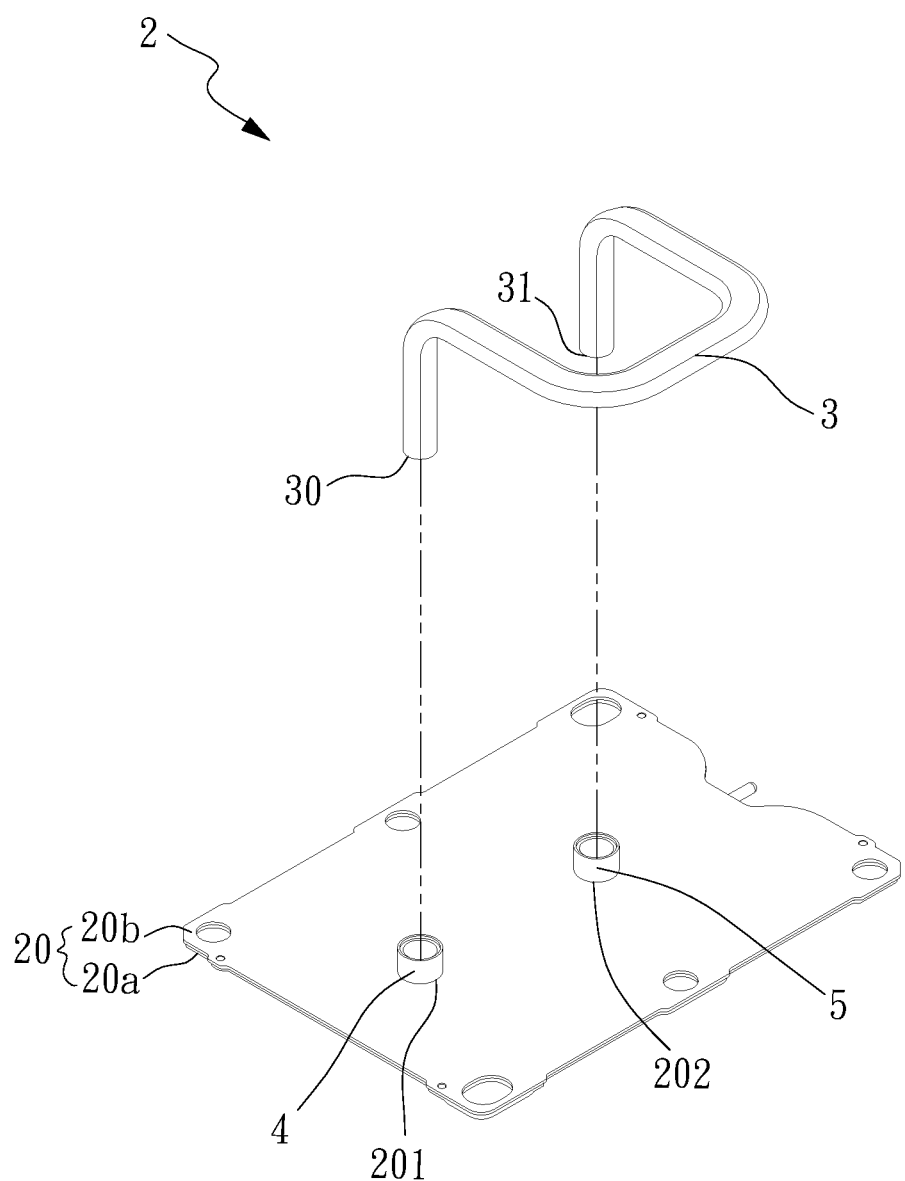
FIG. 1 is a perspective exploded view of a first embodiment of the complex vapor chamber structure of the present invention.
Figure 2:
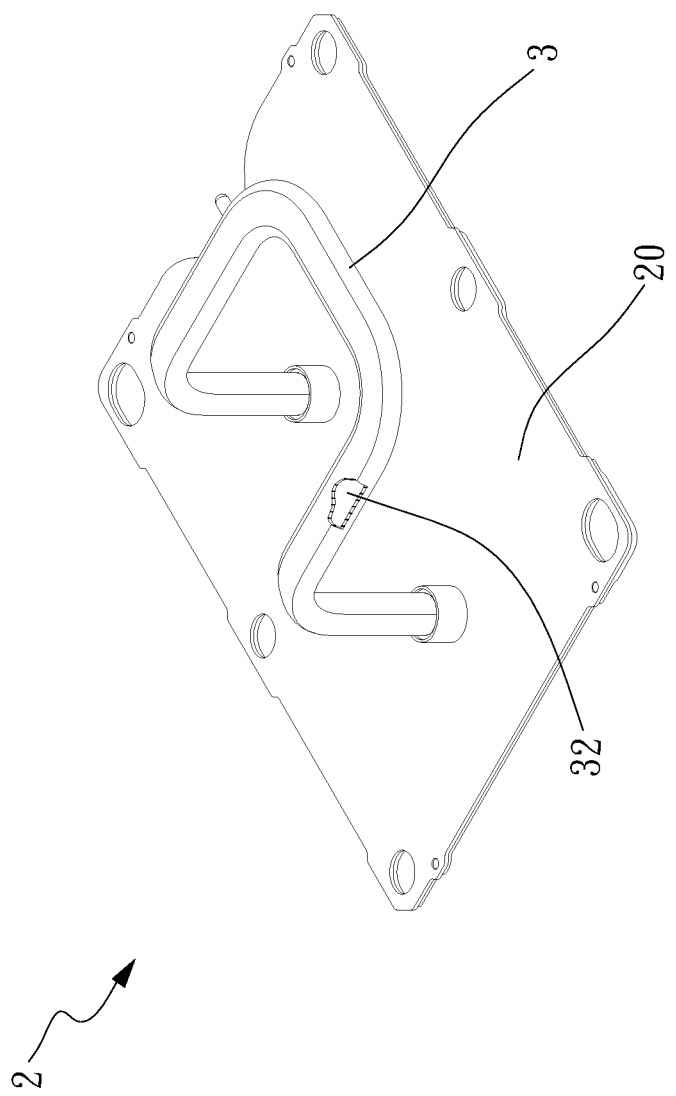
FIG. 2 is a perspective assembled view of the first embodiment of the complex vapor chamber structure of the present invention.
Figure 3:
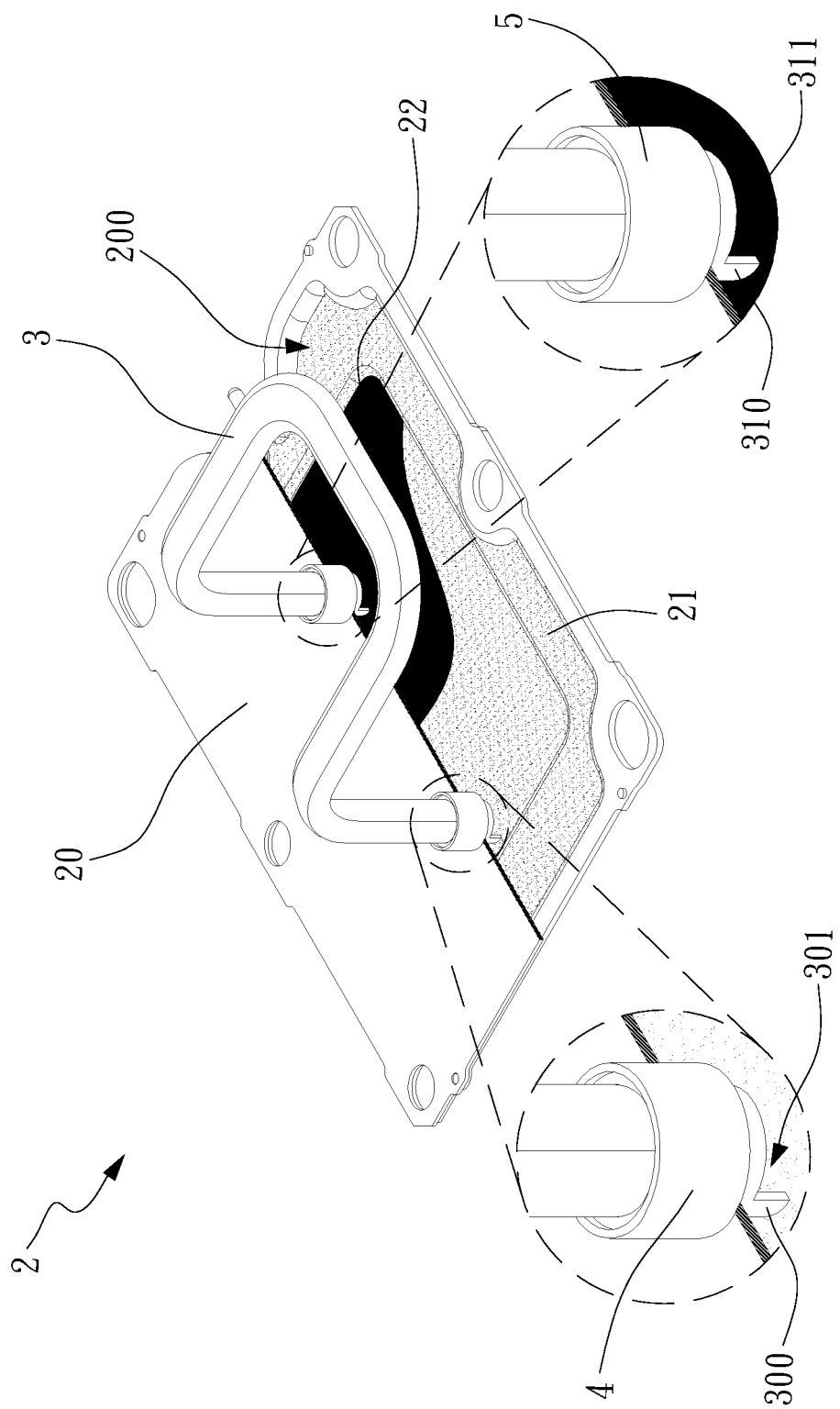
FIG. 3 is a perspective partially sectional view of a second embodiment of the complex vapor chamber structure of the present invention.

Please refer to FIGS. 1, 2 and 3. FIG. 1 is a perspective exploded view of a first embodiment of the complex vapor chamber structure of the present invention. FIG. 2 is a perspective assembled view of the first embodiment of the complex vapor chamber structure of the present invention. FIG. 3 is a perspective partially sectional view of a second embodiment of the complex vapor chamber structure of the present invention. As shown in the drawings, the complex vapor chamber structure 2 of the present invention includes a main body 20 and at least one tubular body 3.

The main body 20 is composed of a first plate body 20a and a second plate body 20b, which are correspondingly mated with each other to together define a first chamber 200. In this embodiment, the main body 20 is selectively a vapor chamber or a heat plate or any equivalent capable of achieving the effect of the present invention.

The second plate body 20b is formed with a first opening 201 and a second opening 202 in communication with the first chamber 200. A first capillary structure 21 is disposed in the first chamber 200 and a working fluid 22 is filled in the first chamber 200.

The tubular body 3 has a first end 30 and a second end 31. The tubular body 3 is formed with an internal passage 32. The first and second ends 30, 31 are respectively correspondingly inserted in the first and second openings 201, 202 of the main body 20, whereby the passage 32 of the tubular body 3 can communicate with the first chamber 200 of the main body 20 via the first and second ends 30, 31. It can be clearly seen from FIGS. 1 and 2 that the tubular body 3 inserted on the main body 20 has a substantially U-shaped configuration in a top view.

The main body 20 and the tubular body 3 are made of a material selected from a group consisting of copper, aluminum, iron, stainless steel, titanium and titanium alloy. The main body 20 and the tubular body 3 can be made of the same material or different materials in combination with each other.

In addition, in this embodiment, the tubular body 3 is selectively a circular heat pipe or a flat-plate heat pipe or a D-shaped heat pipe or any equivalent capable of achieving the effect of the present invention.

A second capillary structure (not shown) can be further disposed on the inner wall of the passage 32. Alternatively, the inner wall of the passage 32 is free from the second capillary structure (as shown in FIG. 2). In this embodiment, the inner wall of the passage 32 is, but not limited to, free from the second capillary structure for illustration purposes.

Preferably, the first and second capillary structures 21 are, but not limited to, powder sintered bodies. In practice, the first and second capillary structures 21 can be alternatively selected from a group consisting of mesh body, fiber body, channeled body and woven body. The first and second capillary structures 21 can be selectively the same structure body or different structure bodies or complex capillary structures. The first and second capillary structures 21 can be formed by means of electrochemical deposition, electroforming, 3D printing or printing.

In addition, a coating (not shown) can be directly disposed on the inner wall of the main body 20 and the tubular body 3. Alternatively, the coating can be further disposed on the first and second capillary structures 21 to enhance the vapor-liquid circulation efficiency thereof. The coating is a hydrophilic coating or a hydrophobic coating.

Please further refer to FIG. 1. The complex vapor chamber structure 2 further has at least one first hub 4 and at least one second hub 5 correspondingly disposed on the first and second openings 201, 202 of the second plate body 20b. The first and second ends 30, 31 of the tubular body 3 are respectively correspondingly connected to the first and second hubs 4, 5.

Please refer to FIG. 3, which is a perspective partially sectional view of a second embodiment of the complex vapor chamber structure of the present invention. The first and second ends 30, 31 of the tubular body 3 are respectively formed with a first extension section 300 and a second extension section 310, which respectively outward extend. The first extension section 300 and the second extension section 310 are plugged into the first chamber 200 of the main body 20. The first extension section 300 and the second extension section 310 are respectively formed with at least one first notch 301 and at least one second notch 311. The first and second notches 301, 311 communicate with the first chamber 200 of the main body 20. The first extension section 300 and the second extension section 310 abut against the bottom side of the first chamber 200 as shown in FIG. 3, (that is, one side of the first capillary structure 21). Alternatively, the first extension section 300 and the second extension section 310 do not abut against the bottom side of the first chamber 200 (not shown).

According to the structural design of the present invention, the main body 20 is attached to at least one heat source (not shown). At this time, the first plate body 20a (the evaporation section) of the main body 20 will first absorb the heat generated by the heat source, whereby the liquid working fluid 22 in the first chamber 200 will evaporate into vapor working fluid 22. Part of the vapor working fluid 22 will spread to conduct the heat to the second plate body 20b (the condensation section) of the main body 20. At the condensation section, the vapor working fluid 22 is cooled and condensed into the liquid working fluid 22. The liquid working fluid 22 drops onto the first capillary structure 21 and flows back to the first plate body 20a to continue the vapor-liquid circulation and achieve the heat spreading and dissipation effect.

In addition, as aforesaid, the passage 32 of the tubular body 3 communicates with the first chamber 200 of the main body 20. Therefore, the other part of the vapor working fluid 22 will spread to the passage 32 of the tubular body 3 and condense into the liquid working fluid 22. Therefore, the complex vapor chamber structure 2 of the present invention has both two-dimensional and three-dimensional heat conduction manners, whereby the first chamber 200 of the main body 20 and the passage 32 of the tubular body 3 form a loop for the vapor-liquid circulation. This can greatly enhance the heat dissipation efficiency as a whole.

Figure 4:
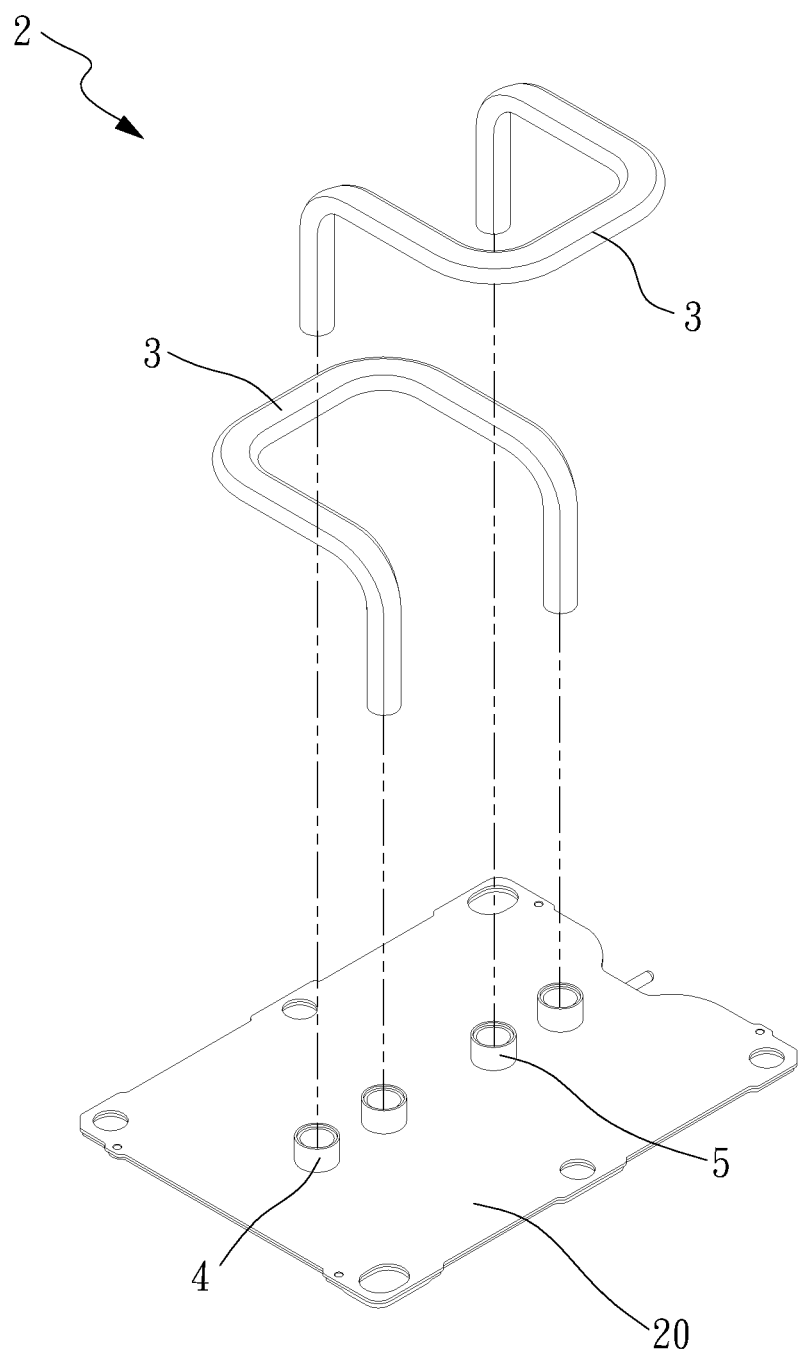
FIG. 4 is a perspective exploded view of a third embodiment of the complex vapor chamber structure of the present invention.
Figure 5:
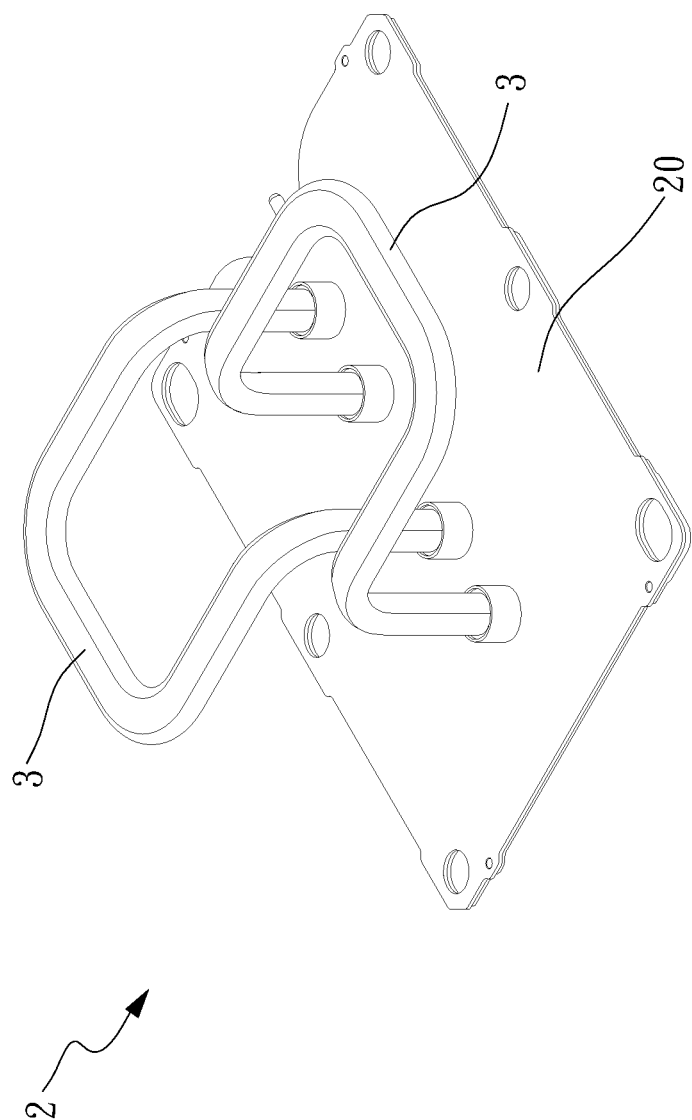
FIG. 5 is a perspective assembled view of the third embodiment of the complex vapor chamber structure of the present invention.
Figure 6:
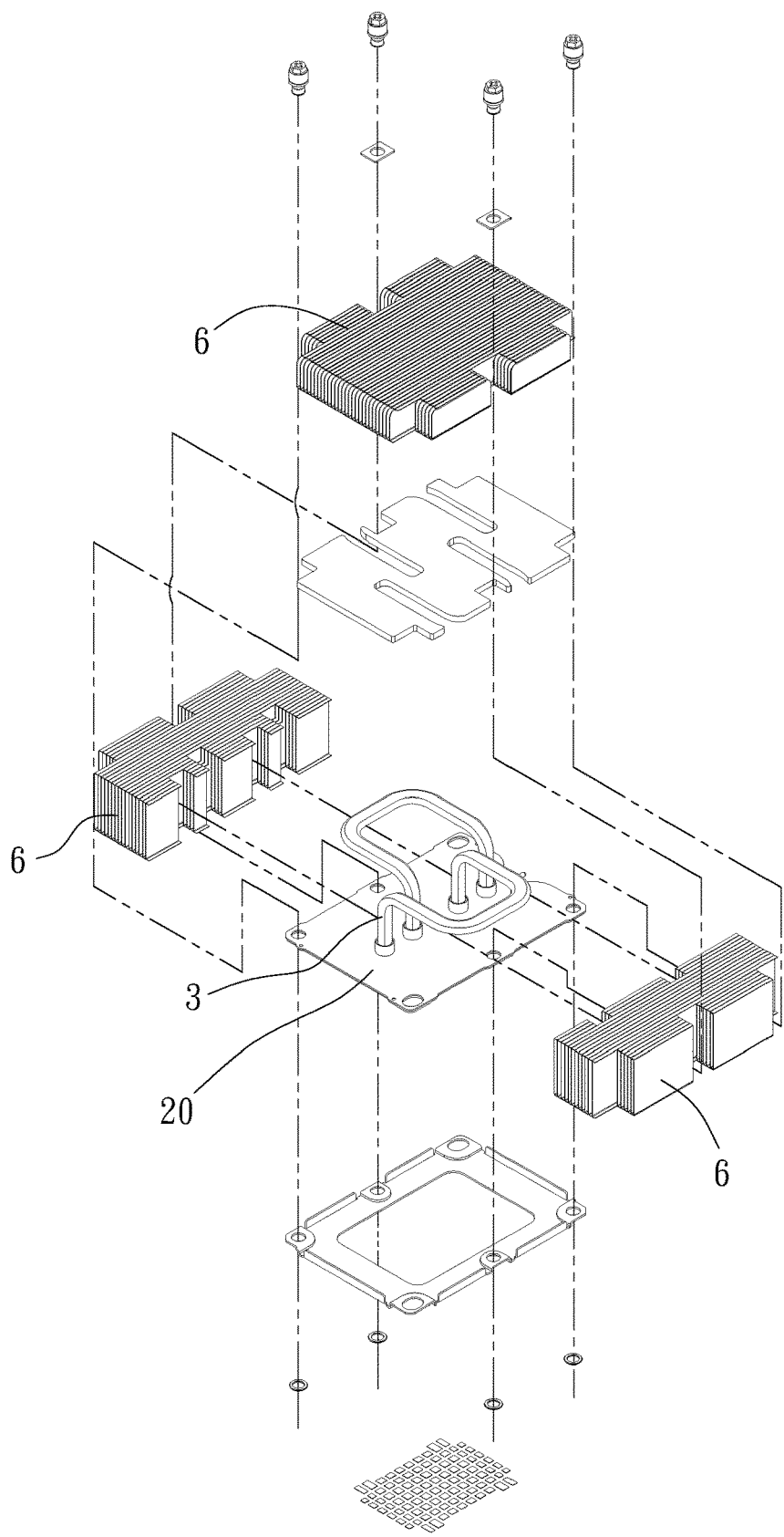
FIG. 6 is a perspective exploded view showing the application of the third embodiment of the complex vapor chamber structure of the present invention.

Please now refer to FIGS. 4, 5 and 6. FIG. 4 is a perspective exploded view of a third embodiment of the complex vapor chamber structure of the present invention. FIG. 5 is a perspective assembled view of the third embodiment of the complex vapor chamber structure of the present invention. FIG. 6 is a perspective exploded view showing the application of the third embodiment of the complex vapor chamber structure of the present invention. The third embodiment is different from the first embodiment in that the number and the position of the tubular bodies 3 disposed on the main body 20 are not limited. For example, two tubular bodies 3 can be disposed on the main body 20. The arrangement and number of the tubular bodies 3 can be adjusted in accordance with the requirement of a user. Also, the tubular bodies 3 can be combined with different structures and heights of radiating fin assemblies 6 (as shown in FIG. 6). This can achieve the same effect.

In conclusion, in comparison with the conventional structure, the present invention has the following advantages:

1. The heat dissipation efficiency is greatly enhanced.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A complex vapor chamber structure comprising:
 a main body having a first chamber, a first opening and a second opening, a first capillary structure being disposed in the first chamber, a working fluid being filled in the first chamber, the first and second openings passing through one face of the main body to communicate with the first chamber; and
 at least one tubular body having a first opening end, a second opening end and a passage, the first and second opening ends being respectively correspondingly inserted in the first and second openings in the main body, whereby the passage of the tubular body is in fluid communication with first chamber via the first and second opening ends, wherein the at least one tubular body has a first portion extending perpendicularly to said one face and a second portion having a substantially U-shaped configuration extended from the first portion and being parallel to said one face.

2. The complex vapor chamber structure as claimed in claim 1, wherein a second capillary structure is further disposed on inner wall of the passage.

3. The complex vapor chamber structure as claimed in claim 1, wherein the main body is composed of a first plate body and a second plate body, which are correspondingly mated with each other to together define the first chamber, the first and second openings passing through the second plate body.

4. The complex vapor chamber structure as claimed in claim 1, further comprising at least one first hub and at least one second hub correspondingly disposed on the first and second openings, the first and second ends of the tubular body being correspondingly connected to the first and second hubs.

5. The complex vapor chamber structure as claimed in claim 1, wherein the first and second ends of the tubular body respectively have a first extension section and a second extension section, the first extension section and the second extension section being plugged into the first chamber of the main body, the first extension section and the second extension section being in abutment against a bottom side of the first chamber or not in abutment against the bottom side of the first chamber.

6. The complex vapor chamber structure as claimed in claim 5, wherein the first extension section and the second extension section are respectively formed with at least one first notch and at least one second notch, the first and second notches communicating with the first chamber.

7. The complex vapor chamber structure as claimed in claim 1, wherein the main body is a vapor chamber or a heat plate.

8. The complex vapor chamber structure as claimed in claim 1, wherein the tubular body is a circular heat pipe or a flat-plate heat pipe or a D-shaped heat pipe.

9. The complex vapor chamber structure as claimed in claim 2, wherein the first and second capillary structures are selected from a group consisting of powder sintered body, mesh body, fiber body, channeled body and woven body, the first and second capillary structures being selectively the same structure body or different structure bodies.

10. The complex vapor chamber structure as claimed in claim 2, wherein the first and second capillary structures are formed by means of electrochemical deposition, electroforming, 3D printing or printing.

11. The complex vapor chamber structure as claimed in claim 1, further comprising a coating formed on the inner walls of the main body and the tubular body.

12. The complex vapor chamber structure as claimed in claim 1, wherein the main body and the tubular body are made of a material selected from a group consisting of copper, aluminum, iron, stainless steel, titanium and titanium alloy, the main body and the tubular body being made of the same material or different materials in combination with each other.

\* \* \* \* \*